United States Patent [19]

Itano et al.

[11] Patent Number: 4,912,677
[45] Date of Patent: Mar. 27, 1990

[54] PROGRAMMABLE LOGIC DEVICE

[75] Inventors: Kiyoshi Itano; Kohji Shimbayashi, both of Kawasaki, Japan

[73] Assignees: Fujitsu Limited, Kawasaki; Fujitsu VLSI Limited, Kasugai, both of Japan

[21] Appl. No.: 204,842

[22] Filed: Jun. 10, 1988

[30] Foreign Application Priority Data

Jun. 12, 1987 [JP] Japan .................................. 62-145035

[51] Int. Cl.⁴ .............................................. G11C 7/00
[52] U.S. Cl. ........................ 365/189.08; 365/230.08; 307/465; 340/825.83
[58] Field of Search ............. 365/185, 189.05, 189.08, 365/230.08; 364/716; 307/465, 468; 340/825.83

[56] References Cited

U.S. PATENT DOCUMENTS

| 4,041,459 | 8/1977 | Horninger | 340/825.83 |
| 4,488,229 | 12/1984 | Harrison | 364/716 X |
| 4,661,922 | 4/1987 | Thierbach | 364/716 |
| 4,745,579 | 5/1988 | Mead et al. | 364/716 X |

Primary Examiner—Joseph A. Popek
Attorney, Agent, or Firm—Armstrong, Nikaido, Marmelstein, Kubovcik & Murray

[57] ABSTRACT

A programmable logic device includes an AND array; an OR array; a buffer circuit connected between the AND array and OR array; and a number of decoder arrangements operatively connected to the AND array and OR array. By constituting the buffer such that the AND array and OR array are electrically associated even in a write operation of data, namely, the buffer is brought to an enable state, a logic verify of the buffer becomes unnecessary and, accordingly, a verify/check of written data can be carried out both easily and efficiently.

6 Claims, 8 Drawing Sheets

PROGRAMMABLE LOGIC DEVICE

BACKGROUND OF THE INVENTION

1. Field of the Invention

The present invention relates to a programmable logic device (PLD) and, more particularly, to an arrangement of a programmable logic array (PLA) comprising a programmable AND array performing a logical "and" operation, a programmable OR array performing a logical "or" operation, and the associated drive-, output- and feedback-circuits.

Note, in the following description, a mode in which a normal operation of the PLD, i.e., a normal logical operation of the "and" operation and "or" operation, is carried out will be referred to hereinafter as a normal mode. Also, a mode in which data is written into the cell array and then a verification of whether or not the data is correctly written is carried out, will be referred to hereinafter as a program mode.

2. Description of the Related Art

Figure 1:
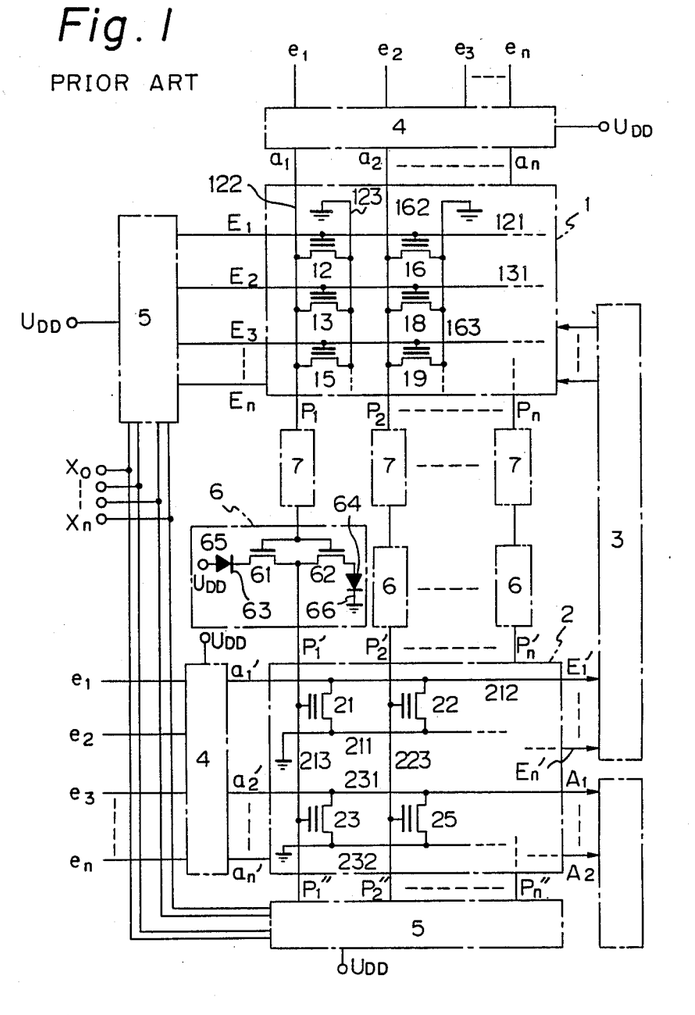
FIG. 1 is a circuit diagram illustrating a constitution of an example of the prior art PLA.

FIG. 1 illustrates a circuit constitution of a known PLA, as disclosed in U.S. Pat. No. 4,041,459. In FIG. 1, reference 1 denotes an AND array or matrix and reference 2 denotes an OR array or matrix. References 6 and 7 denote buffers, each including a complementary metal oxide semiconductor (CMOS) inverter composed of transistors 61 and 62, which are connected between the AND array 1 and the OR array 2, reference 4 denotes a decoder arrangement functioning as a data input/output (I/O) buffer, and reference 5 denotes a decoder. The data I/O buffer 4 and decoder 5 are provided for each of the AND array 1 and OR array 2.

In the program mode, data is written into the cell array by the data I/O buffer 4 and decoder 5 and then a verification of whether or not the data is correctly written is carried out by the corresponding data I/O buffer 4. The above verification will be referred to hereinafter as a program verify. For example, where data is written into the OR array, control lines, i.e., product term lines $P_1' \sim P_n'$, are driven to high voltage higher than a voltage normally employed in the read operation. Accordingly, to prevent the high voltage present at the product term lines from exerting an influence on the AND array side, the buffers 6 and 7 are brought to a floating state, i.e., a disable state. At the same time, a diode 63 reversely inserted between the CMOS inverter 61, 62 and a power supply line $U_{DD}$ in the buffer 6 prevents a current flow from the product term lines $P_1' \sim P_n'$ toward the power supply line.

Namely, according to the constitution of the PLA shown in FIG. 1, the buffers 6 and 7 are disabled in the program mode, resulting in a separation of the AND array add the OR array. In other words, the AND array and OR array are not electrically associated in the program mode.

Therefore, when data is written into the AND array and the written data is then read out through the OR array, a problem occurs. Namely, since the buffers 6 and 7 are disabled and the AND array and the OR array are not electrically associated, the buffers 6 and 7 must be enabled to read out the data written into the AND array through the OR array. At the same time, it must be verified whether or not the buffers are functional, by employing "another means", which will be referred to hereinafter as a logic verify. But a large amount of test pattern data must be employed for the verification, and the logic verify must be carried out, and therefore, when data is written into the AND array and the logic verify of the data is then carried out, the processing is made remarkably complicated and cumbersome, which is not preferable from the viewpoint of the efficiency of the verify/check operation.

Note, in the following description, the term verify-check implies both a program verify and a logic verify.

SUMMARY OF THE INVENTION

An object of the present invention is to provide a programmable logic device in which a logic verify of a buffer connected between an AND array and an OR array becomes unnecessary, and thus a verify/check of written data can be easily carried out.

The above object is attained by providing a programmable logic device comprising: an AND array having a programmable memory cell provided at each intersection between a plurality of input term lines and a first plurality of product term lines; an OR array having a programmable memory cell provided at each intersection between a second plurality of product term lines of the same number as the first plurality of product term lines and a plurality of output term lines; a first decoder arrangement operatively connected to the AND array and selecting one of the input term lines in response to a first address signal when the AND array is selected; a second decoder arrangement operatively connected to the AND array and selecting one of the first product term lines in response to a second address signal when one of the AND array and the OR array is selected; a third decoder arrangement operatively connected to the OR array and selecting one of the output term lines in response to a third address signal when said OR array is selected; and a buffer circuit operatively connected between the first plurality of product term lines and the second plurality of product term lines and converting a voltage of the first product term lines to a higher voltage for programming the OR array by the second and third decoder arrangements.

BRIEF DESCRIPTION OF THE DRAWINGS

Other objects and features of the present invention will be described hereafter in detail by way of preferred embodiments with reference to the accompanying drawings, in which.

DESCRIPTION OF THE PREFERRED EMBODIMENTS

A preferred embodiment of the present invention will now be described in detail with reference to FIGS. 2 to 7.

Figure 2:
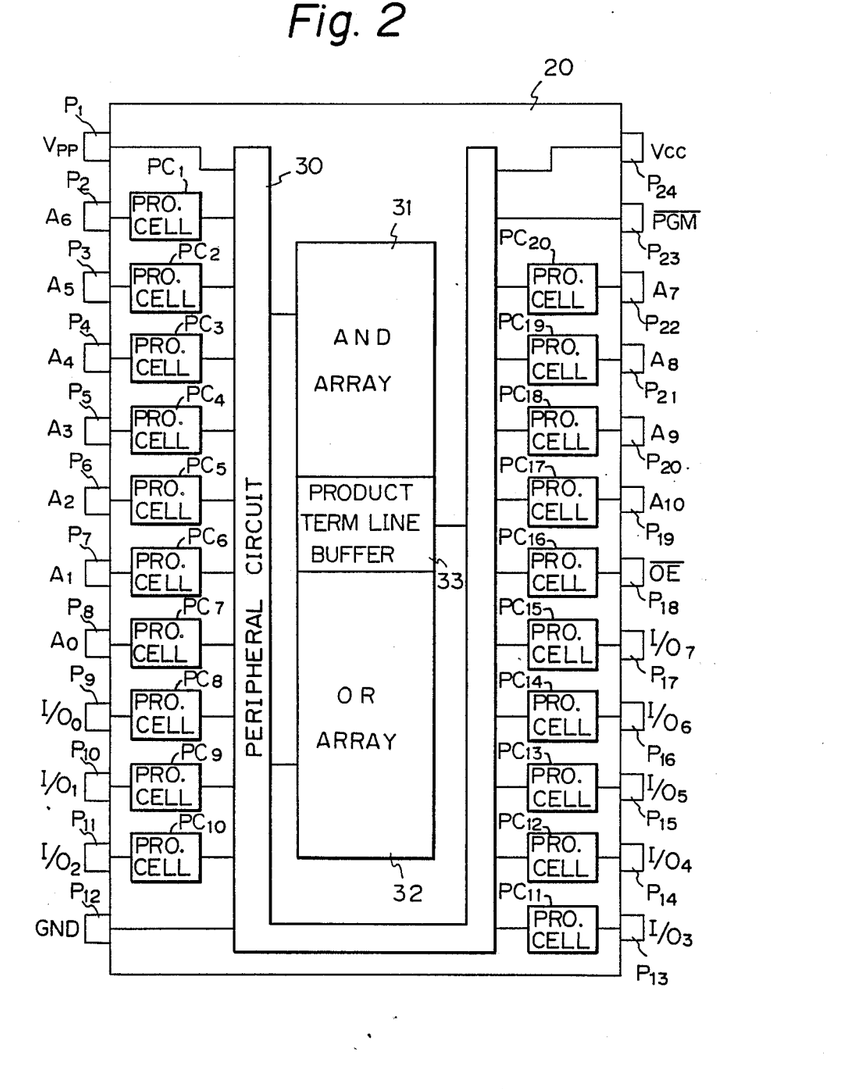
FIG. 2 is a schematic block diagram showing a constitution of the PLD as an embodiment of the present invention.

FIG. 2 schematically illustrates a constitution of the PLD as an embodiment of the present invention.

In FIG. 2, reference 20 denotes the PLD in the form of a chip having twenty four pin terminals $P_1$ to $P_{24}$. The pin terminal $P_1$ is used for receiving a first clock signal, which is employed for effecting the operation of each of programmable I/O cells $PC_1$ to $PC_{20}$, in the normal mode, and for receiving a high voltage $V_{PP}$, 12.5 V in the present example, necessary for writing data into the cell in the program mode. The pin terminals $P_2$ to $P_8$, and $P_{19}$ to $P_{22}$ are used as I/O data terminals in the normal mode and used as input terminals of an address signal $A_0 \sim A_{10}$ having eleven bits, in the program mode. The pin terminals $P_9$ to $P_{11}$, and $P_{13}$ to $P_{17}$ are used as I/O terminals for data $I/O_0 \sim I/O_7$ having eight bits in both the normal mode and the program mode. The pin terminal $P_{12}$ is used as a ground terminal, nd the pin terminal $P_{18}$ is used as an I/O data terminal in the normal mode and as an input terminal for a low active output enable signal OE in the program mode. The pin terminal $P_{23}$ is used for receiving a second clock signal having the same function as the first clock signal in the normal mode, and for receiving a low active program signal $\overline{PGM}$ instructing a writing of data into the cell in the program mode. The pin terminal $P_{24}$ is used for receiving a power supply voltage $V_{CC}$, 5 V in the present example, in both the normal mode and the program mode. The programmable I/O cells $PC_1$ to $PC_{20}$ are provided between a peripheral circuit 30 and the pin terminals $P_2$ to $P_{11}$, and $P_{13}$ to $P_{22}$, respectively. Each of the programmable I/O cells is constituted by a number of flip-flops (not shown) and switching circuits (not shown), and drives, feeds back or outputs signals or data in response to the first and second clock signals with the aid of the peripheral circuit 30, in the normal mode, and each programmable I/O cell functions as a data input buffer in the program mode.

Reference 31 denotes an AND array having a nonvolatile memory cell such as an electrically programmable read only memory (EPROM) cell (see FIG. 3) provided at each intersection between a plurality of input term lines $E_i$ and a plurality of product term lines $PA_j$, and reference 32 denotes an OR array having the same memory cell as he AND array (see FIG. 3) provided at each intersection between a plurality of product term lines $PO_j$ connected via a product term line buffer 33 to the plurality of product term lines $PA_j$ and a plurality of output term lines $A_k$. A concrete constitution of the product term line buffer 33 and the operation thereof will be described later in detail. The peripheral circuit 30 includes conventional circuits for effecting access to each memory cell, e.g., a data I/O buffer, a row/column decoder, a column gate, a sense amplifying (S/A) circuit and the like, and feeds back, drives or outputs signals or data in association with each of the programmable I/O cells $P_1$ to $PC_{20}$.

Figure 3:
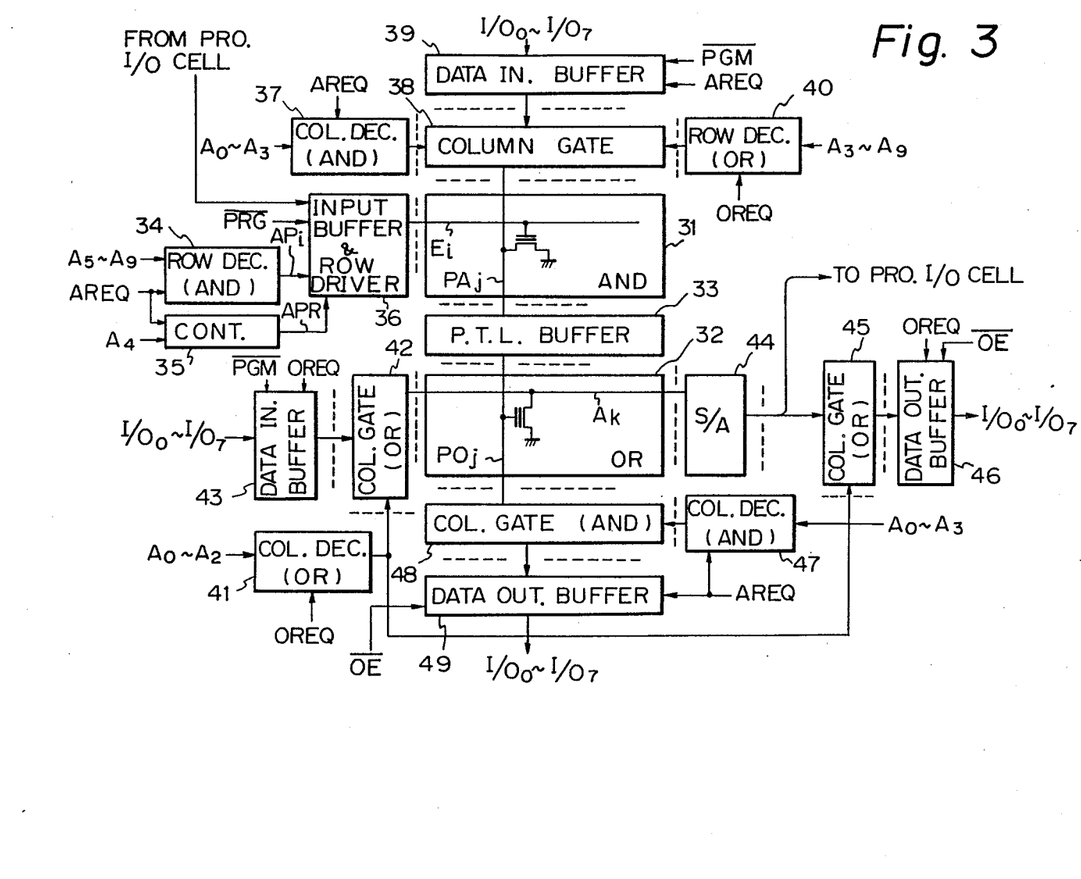
FIG. 3 is a block diagram illustrating a concrete constitution of the PLD shown in FIG. 2.

FIG. 3 illustrates a concrete constitution of the PLD shown in FIG. 2.

In FIG. 3, circuits other than the AND array 31, OR array 32, and product term line buffer 33 constitute the peripheral circuit 30 of FIG. 2. Reference 34 denotes a row decoder for the AND array 31, which outputs a decode signal $AP_i$ in response to a select signal AREQ for selecting the AND array and the address signal $A_5 \sim A_9$ having five bits. Reference 35 denotes a control circuit, which outputs a control signal APR in response to the select signal AREQ and the address signal $A_4$ having one bit. The control signal APR is fixed to a high ("H") level in the normal mode and has an inverted level of the address signal $A_4$ when the AND array is in the program mode. Reference 36 denotes an input buffer and row driver, which responds to a signal or data from each of the programmable I/O cells, the decode signal $AP_i$, the control signal APR, and a low active mode select signal $\overline{PRG}$ indicating either the normal or program mode. The input buffer and row driver 36 buffers the signal or data from the I/O cells in the normal mode, and drives a level of a row line, i.e., the input term line $E_i$, based on the decode signal $AP_i$ to the high voltage $V_{PP}$(12.5 V) when the AND array is in the program mode. The mode select signal $\overline{PRG}$ is generated within the chip when the high voltage $V_{PP}$ is applied to the pin terminal $P_1$.

Reference 37 denotes a column decoder for the AND array 31, which selects one of the column lines, i.e., the product term lines $PA_j$, in response to the select signal AREQ and the address signal $A_0 \sim A_3$ having four bits. Reference 38 denotes a column gate, which enables a selected product term line when data is written into the AND array or the OR array. Reference 39 denotes a data input buffer, which buffers the data $I/O_0 \sim I/O_7$ in response to the program signal $\overline{PGM}$ and the select signal AREQ, and transmits the data to the column gate 38. Reference 40 denotes a row decoder for the OR array 32, which selects one of the row lines, i.e., the product term lines $PA_j$ ($PO_j$), in response to a select signal OREQ for selecting the OR array and the address signal $A_3 \sim A_9$ having seven bits. Reference 41 denotes a column decoder for the OR array 32, which selects one of the column lines, i.e., the output term lines $A_k$, in response to the select signal OREQ and the address signal $A_0 \sim A_2$ having three bits. Reference 42 denotes a column gate, which enables a selected output term line when data is written into the OR array. Reference 43 denotes a data input buffer, which buffers the data $I/O_0 \sim I/O_7$ in response to the program signal $\overline{PGM}$ and the select signal OREQ and transmits the data to the column gate 42.

Reference 44 denotes a sense amplifying (S/A) circuit including a plurality of sense amplifiers provided individually for each of the output term lines $A_k$ and amplifies the data present at the corresponding output term line. The data read out through the S/A circuit 44 is fed to each of the programmable I/O cells and a column gate 45. The column gate 45 enables a selected output to term line when data is read out from the OR array. Reference 46 denotes a data output buffer, which buffers the data read out through the column gate 45 in response to the output enable signal $\overline{OE}$ and the select signal OREQ and outputs the data as the output data $I/O_0 \sim I/O_7$. Reference 47 denotes a column decoder for the AND array 31, which selects one of the column lines, i.e., the product term lines $PO_j$, in response to the select signal AREQ and the address signal $A_0 \sim A_3$ having four bits. Reference 48 denotes a column gate for the AND array 31, which enables a selected product term line when data is read out from the AND array. Reference 49 denotes a data output buffer, which buffers the data read out through the column gate 48 in response to the output enable signal $\overline{OE}$ and the select signal AREQ and outputs the data as the output data I/O$_0$~I/O$_7$.

Next, a concrete constitution of the product term line buffer 33 nd the operation thereof will be explained with reference to FIG. 4. Note, to simplify the explanation, it is assumed that there is one product term line PA$_j$ ( PO$_j$), four input term lines E$_i$, and three output term lines A$_k$.

Figure 4:
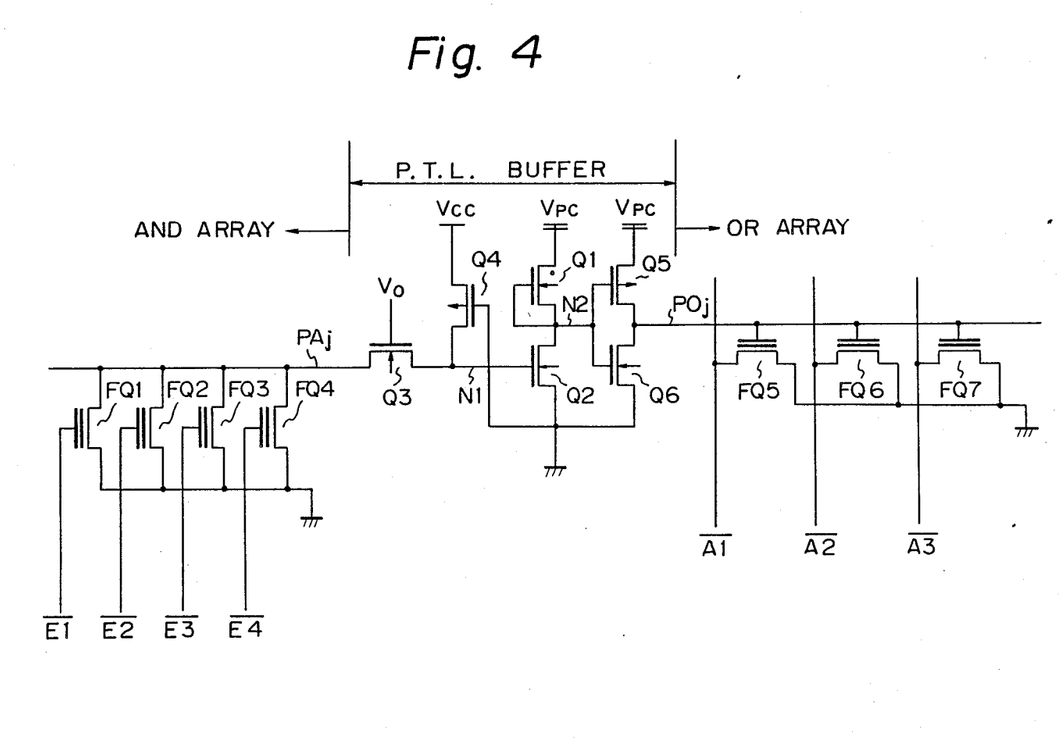
FIG. 4 is a circuit diagram illustrating a constitution of the product term line buffer shown in FIG. 3.

In FIG. 4, reference FQ1~FQ4 denote EPROM cells constituting memory cells in the AND array 31. A source of each of the cells is grounded and a drain thereof is connected to the product term line PA$_j$. Also, each gate is connected to the input term lines E1~E4, respectively. Similarly, references FQ5~FQ7 denote EPROM cells constituting memory cells in the OR array 32. A source of each of the cells is grounded and a gate thereof is connected to the product term line PO$_j$. Also, each drain is connected to the output term lines A1~A3, respectively.

In the product term line buffer, a depletion type load transistor Q1 and an enhancement type drive transistor Q2 constitute an N-type MOS (NMOS) inverter. A drain of the load transistor Q1 is connected to a higher voltage power supply line V$_{PC}$ and a source of the drive transistor Q2 is grounded. The power supply line V$_{PC}$ can have two voltage values, i.e., V$_{PP}$(12.5 V) if data is written into the cell array and V$_{CC}$(5 V) if data is not written in. Reference Q3 denotes an N channel type transistor, which is connected between a gate (node N1) of the drive transistor Q2 and the product term line PA$_j$, having a gate which receives a bias voltage V$_0$ preset to a predetermined voltage. Reference Q4 denotes a P channel type transistor, which is connected between the node N1 and the power supply line V$_{CC}$, having a gate which is grounded. A P channel type transistor Q5 and an N channel type transistor Q6 constitute a CMOS inverter, which is connected between the power supply line V$_{PC}$ and the ground and inverts the output (node N2) of the NMOS inverter and feeds the inverted output of the product term line PO$_j$.

In to the operation of the buffer 33, the signal or data present at the product term line PA$_j$ is amplified through the transistor Q3 (node N1), inverted through the NMOS inverter (node N2), inverted through the CMOS inverter, and output to the product term line PO$_j$. On the other hand, the transistor Q4 has a function of quickly raising the potential at the node N1 when the product term line PA$_j$ is precharged by clock pulses generated within the chip. Also, since the potential at the node N1 rises to a V$_{CC}'$ (5 V) level at highest and, accordingly, a drain erase stress is not exerted on the product term line PA$_j$ in the AND array side, the NMOS inverter (Q1, Q2) effects a voltage level conversion when data is written into the OR array. Furthermore, where a precharging of the output term lines A1~A3 is carried out by internal clock pulses, and the transistor Q2 is turned OFF during the generation of the interval clock pulses, the above precharging can be carried out easily and quickly, because the level at the product term line PO$_j$ is lowered to a low ("L") level by turning ON the transistor Q6. Accordingly, the P.T.L. buffer 33 is a preferred form of a PLA effecting a dynamic operation.

In FIG. 4, the transistor Q3 functions as a clamp circuit in both the normal mode and the program mode of the OR array. When the bias voltage V$_0$ is preset to the voltage of $\frac{1}{2}$ V$_{cc}$, an amplitude of the potential at the product term line PA$_j$ is fixed to a value of ($\frac{1}{2}$ V$_{cc}$-V$_{th}$ (Q$_3$). For example, when the V$_{th}$ is 1V, the amplitude of the potential at the line PA$_j$ is clamped to 1.5V. The bias voltage V$_0$ is set to 0V in the program mode of the AND array and, accordingly, the P.T.L. buffer 33 is brought to a disable state. The other transistors Q1, Q2, Q4, Q5 and Q6 function as a level shift circuit, i.e., a voltage level converter, in the program mode of the OR array, and as a sense amplifier in the normal mode.

Figure 5:
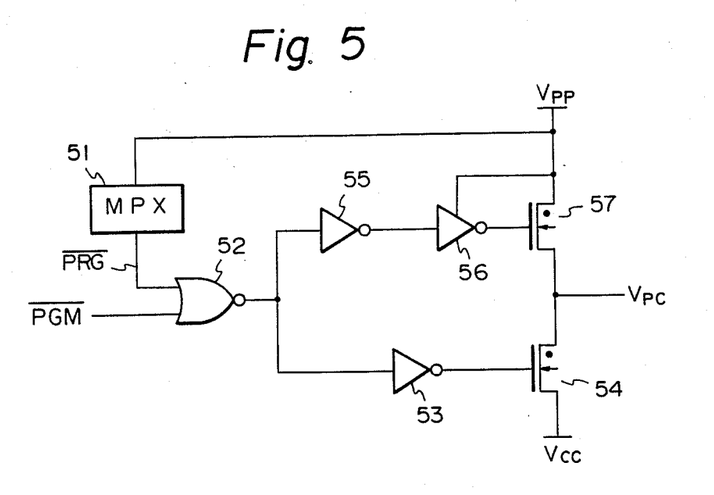
FIG. 5 is a circuit diagram illustrating a constitution of the circuit for generating the voltage $V_{PC}$ shown in FIG. 4.

FIG. 5 illustrates a constitution of the circuit for generating the voltage V$_{PC}$ shown in FIG. 4.

The circuit of FIG. 5 is constituted by a multiplex select circuit (MPX) 51 generating the mode select signal $\overline{PRG}$ of "L" level in response to the application of the high voltage V$_{PP}$, a NOR gate 52 responding to the mode select signal $\overline{PRG}$ and the program signal $\overline{PGM}$, an inverter 53 responding to the output of the NOR gate 52, a depletion type transistor 54 responding to the output of the inverter 53, an inverter 55 responding to the output of the NOR gate 52, an inverter 56 responding to the output of the inverter 55, and a depletion type transistor 57 responding to the output of the inverter 56. A source of the transistor 54 is connected to the power supply line V$_{CC}$ (5 V) and a drain of the transistor 57 is connected to the power supply line V$_{PP}$ (12.5 V). A drain of the transistor 54 and a source of the transistor 57 are commonly connected, and the high voltage V$_{PC}$ is obtained from the common connection. Also, the inverter 56 is constituted by a CMOS structure connected between the voltage line V$_{PP}$ and the ground, and each of the inverters 53 and 55 is constituted by a CMOS structure connected between the voltage line V$_{CC}$ and the ground.

According to the constitution of the circuit of FIG. 5, when the program mode is selected and the writing of data is carried out, the signals $\overline{PRG}$ and $\overline{PGM}$ are "L" level. Since the output of the NO gate 52 is "H" level, the gate of th transistor 54 receives a voltage of "L" level (0 V) and the gate of the transistor 57 receives a voltage of "H" level (12.5 V). Accordingly, the transistor 54 is made OFF and the transistor 57 is made ON, and thus the high voltage V$_{PP}$ (12.5 V) appears at the line V$_{PC}$. On the other hand, when the program mode is selected and the reading-out of data is carried out, or when the normal mode is selected, at least one of the signals $\overline{PRG}$ and $\overline{PGM}$ is "H" level. Accordingly, the output o the NOR gate 52 is "L" level and the gate of the transistor 54 receives a voltage of "H" level (5 V), and thus the high voltage V$_{CC}$ (5 V) is applied to the line V$_{PC}$.

Figure 6:
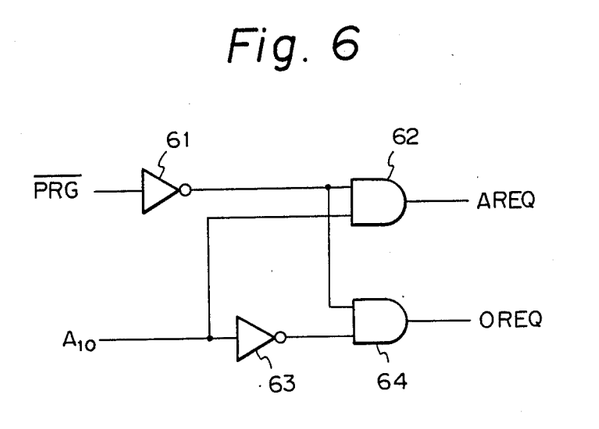
FIG. 6 is a circuit diagram illustrating a constitution of the circuit for selecting the AND array or the OR array shown in FIG. 3.

FIG. 6 illustrates a constitution of the circuit for selecting the AND array or the OR array.

The circuit of FIG. 6 is constituted by an inverter 61 responding to the mode select signal $\overline{PRG}$, an AND gate 62 responding t the output of the inverter 61 and the address signal A$_{10}$, and inverter 63 responding to the address signal A$_{10}$, and an AND gate 64 responding to the outputs of the inverters 61 and 63.

When the program mode is selected and the address signal A$_{10}$ is "H" level, the AND gate 62 is opened and outputs the select signal AREQ of "H" level. On the other hand, when the program mode is selected and the address signal A$_{10}$ is "L" level, and AND gate 64 is opened and outputs the select signal OREQ of "H" level.

Figure 7:
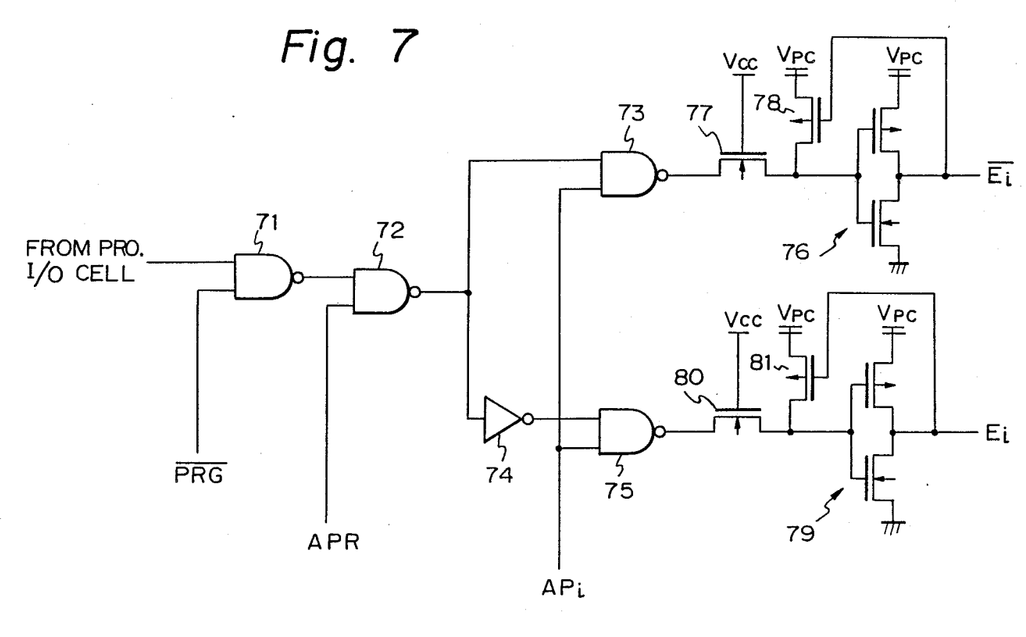
FIG. 7 is a circuit diagram illustrating a constitution of a portion of the input buffer and row driver shown in FIG. 3.

FIG. 7 illustrates a constitution of a portion of the input buffer and row driver 36 shown in FIG. 3.

The circuit of FIG. 7 is constituted by an NAND gate 71 responding to the signal or data from the programmable I/O cell and the mode select signal $\overline{PRG}$, an NAND gate 72 responding to the output of the NAND gate 71 and the control signal APR, and NAND gate 73 responding to the output of the NAND gate 72 and the decode signal $AP_1$, an inverter 74 responding to the output of the NAND gate 72, an NAND gate 75 responding to the output of the inverter 74 and the decode signal $AP_i$, an inverter 776 constituted by a CMOS structure connected between the voltage line $V_{pc}$ and the ground, an N channel transistor 77 connected between th output of the NAND gate 73 and the input of the inverter 76 and having a gate connected to the voltage line $V_{cc}$, a P channel transistor 78 connected between the voltage line $V_{cc}$ and the input of the inverter 76 and having a gate connected to the output of the inverter 76, an inverter 79 constituted by a CMOS structure connected between the voltage line $V_{pc}$ and the ground, an N channel transistor 80 connected between the output of the NAND gate 75 and the input of the inverter 79 and having a gate connected to the voltage line $V_{cc}$, a P channel transistor 81 connected between the voltage line $V_{cc}$ and the input of the inverter 79 and having a gate connected to the output of the inverter 79. Although the circuit of FIG. 7 is shown with respect to the input term line having one bit, to simplify the explanation, the input buffer and row driver 36 is actually composed of the circuits of the same number as the number of input term lines.

In the constitution of the circuit of FIG. 7, when the program mode is selected, the mode select signal $\overline{PRG}$ is "L" level and the control signal APR has the inverted level of the address signal $A_4$. Accordingly, the output of the NAND gate 71 is fixed to "H" level and the output of the NAND gate 72 is changed in accordance with the level of the address signal $A_4$ (APR). Therefore, the levels at the pair of input term lines $E_i$ and $\overline{E}_i$ are changed to $V_{PC}(12.5 V)$ or 0 V, depending upon the level of the address signal $A_4$ (APR). Namely, the input term lines are driven to the level of $V_{PC}(12.5 V)$ or 0 V. On the other hand, when the normal mode is selected, the mode select signal $\overline{PRG}$ is "H" level and the control signal APR is fixed to "H" level. Accordingly, the NAND gates 71 and 72 are opened and the data or signal from the I/O cell is transmitted via the NAN gates 71, 72, 73 and the inverter 76 to the input term line $\overline{E}_i$, and transmitted via the NAND gates 71, 72, the inverter 74, the NAND gate 75 and the inverter 77 to the input term line $E_i$. Namely, the circuit of FIG. 7 functions as a buffer in the normal mode.

Next, the operation of the PLD according to the present embodiment will be described in detail (see FIGS. 9a to 9g).

1. Normal Mode

The input buffer and row driver 36 functions as a buffer and the data read out from the OR array 32 is fed via the S/A circuit 44, the programmable I/O cell and the buffer 36 back to the AND array 31. The P.T.L. buffer 33 senses data present at the product term line $PA_j$ in the AND array 31 and transmits the sensed data to the corresponding product term line $PO_j$ in the OR array 32. Namely, the P.T.L buffer 33 functions as a sense amplifier.

2. Program Mode of the AND Array

In this case, the mode select signal $\overline{PRG}$ is lowered to the "L" level and the input buffer and row driver 36 drives a selected row line, i.e., input term line $E_i$. Also, the address signal $A_{10}$ of "H" level is applied, and thus the select signal AREQ of "H" level is generated. As a result, the row decoder 34, control circuit 35, column decoder 37, data input buffer 39, column decoder 47, and data output buffer 49 are enabled.

In the write operation, the row decoder 34 selects one of the input term lines $E_i$ based on a decoding of the address signal $A_5$ $A_9$ and the driver 36 drives the selected line to the level of the high voltage $V_{PP}(12.5 V)$. In this state, the column decoder 37 selects one of the product term lines $PA_j$ based on the address signal $A_0$~$A_3$, and thus the selected line is enabled state by the column gate 3.. When the program signal $\overline{PGM}$ is then lowered to the "L" level, data from the external is input via the data input buffer 39, and via the column gate 38, written into the selected cell. At this time, the P.T.L. buffer 33 does not exert an influence on the OR array 32.

In the read operation, i.e., in the verify/check operation of the written data, the output enable signal $\overline{OE}$ is lowered to the "L" level. The timing of application of the signal OE of "L" level is selected to be a predetermined time after the program signal $\overline{PGM}$ of "L" level is applied. When the signal $\overline{OE}$ of "L" level is applied, the data written into the selected cell in the AND array 31 is read out via the P.T.L. buffer 33, the corresponding product term line $PO_j$ in the OR array 32, the column gate 48 and the data output buffer 49 to the external. In this case, the P.T.L. buffer 33 functions as a sense amplifier as in the normal mode, and accordingly, the sensed data passes only through the OR array 32.

Also, if a fault occurs in either of the product term lines $PA_j$ and $PO_j$, it is possible to easily detect the fault, i.e., a stuck-at-fault, because the P.T.L. buffer 33 is enabled and the AND array and OR array are kept in the electrically associated state.

Furthermore, where a fault occurs in the input buffer and row driver 36 or the input term lines $E_i$, it is possible to easily detect the fault (stuck-at-fault), because the input buffer and row driver 36 is employed as a driver.

3. Program Mode of the OR Array

In this case, the mode select signal $\overline{PRG}$ is lowered to the "L" level and the address signal $A_{10}$ is lowered to the "L" level, resulting in the generation of the select signal OREQ of "H" level and the select signal AREQ of "L" level. Accordingly, since the AND array is not selected, the input buffer and row driver 36 has no influence on the AND array 31. When the select signal OREQ of "H" level is generated, the row decoder 40, column decoder 41, data input buffer 43, and data output buffer 46 are enabled.

In the write operation, the row decoder 40 selects one of the product term lines $PA_j$ based on a decoding of the address signal $A_3$~$A_9$ and the P.T.L. buffer 33 drives the product term line $PO_j$ corresponding to the selected line $PA_j$ to the level of the high voltage $V_{PP}$ (12.5 V). Namely, the P.T.L. buffer 33 functions as a driver feeding the high voltage $V_{PP}$ to the product term line $PO_j$. In this state, the column decoder 41 selects one of the output term lines $A_k$ based on the address signal $A_0$~$A_2$ and thus the selected line is enabled by the column gate 42. When the program signal PGM is then lowered to the "L" level, data from the external is input via the data input buffer 43, and via the column gate 42, written into the selected cell.

At this time, since the potential at the product term line $PA_j$ connected to each drain of the cell transistor FQ1~FQ4 rises to a level of $V_{CC}$ (5 V) at highest, and the potential at the product term line PO$_j$ is raised to a level of $V_{PP}$ (12.5 V), the P.T.L. buffer 33 functions as the voltage level converter.

In the verify/check operation of the written data, the output enable signal $\overline{OE}$ is lowered to the "L" level, and as a result, data written into the selected cell in the OR array 32 is read out via the S/A circuit 44, the column gate 45, and the data output buffer 46 to the external. In this case, the P.T.L. buffer 33 drives the product term line PO$_j$.

Also, if a fault occurs in the output term line A$_k$, it is possible to easily detect such a fault (stuck-at-fault).

As explained above, according to the constitution of the PLD of the present embodiment, the P.T.L. buffer 33 is in the enable state except in the program mode of the AND array. Therefore, when data written into the AND array 31 is read out through the OR array 32, a verify/check of the written data can be easily carried out without carrying out a logic verify of the P.T.L buffer 33.

Although, in the disclosed and illustrated embodiment, the NMOS inverter (Q1, Q2) is employed in the P.T.L. buffer 33, the constitution of the buffer 33 is not restricted thereto: For example, a CMOS inverter may be employed instead of the NMOS inverter, as shown in FIG. 8.

Figure 8:
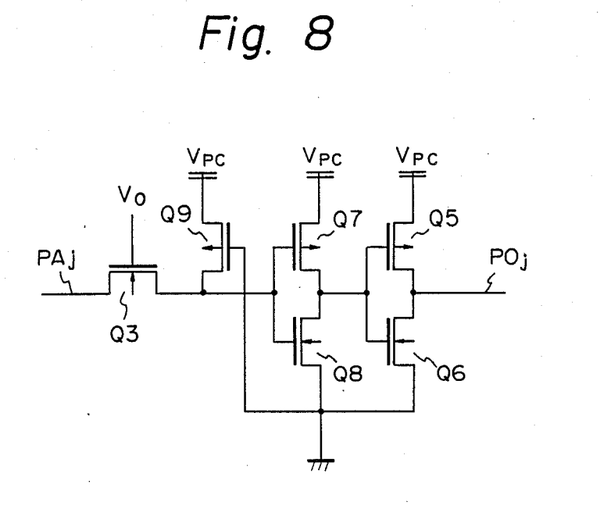
FIG. 8 is a circuit diagram illustrating a modification of the product term line buffer shown in FIG. 4.
Figures 9A, 9B:
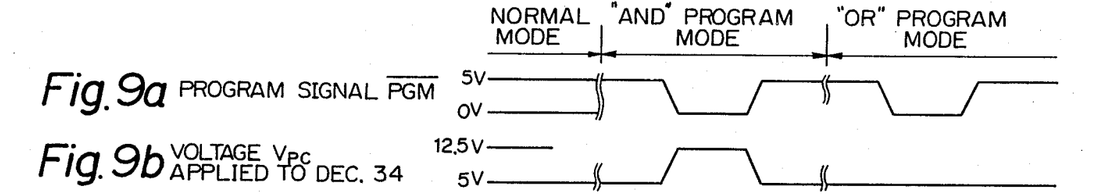
FIGS. 9a to 9g are waveform diagrams showing the operation of the embodiment in FIG. 3.
Figures 9C, 9D:
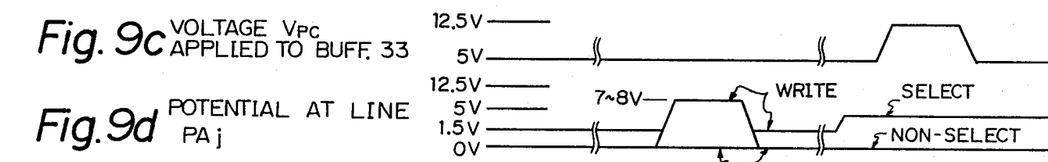
Figure 9E:
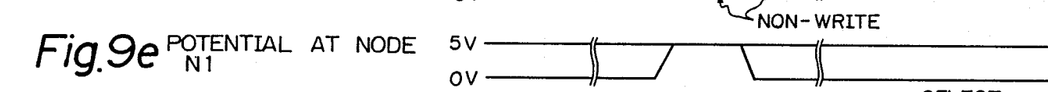
Figure 9F:
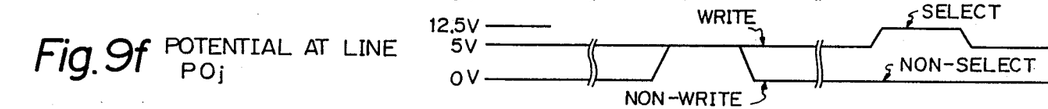
Figure 9G:
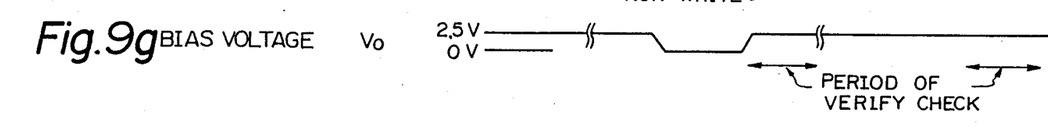

FIG. 8 illustrates a circuit constitution of a modification of the P.T.L. buffer shown in FIG. 4.

The constitution of the P.T.L. buffer of FIG. 8, is different from that of FIG. 4 in the following points: a CMOS inverter including a P channel type transistor Q7 and an N channel type transistor Q8 is employed instead of the NMOS inverter; and a P channel type transistor Q9 connected to the high voltage power supply line $V_{PC}$ is employed instead of the transistor Q4. The P.T.L. buffer of FIG. 8 has further advantages in that, since two CMOS inverter stages are employed, the power dissipated can be decreased, and since a depletion type transistor is not used, the process of manufacturing the device can be simplified.

Although the present invention has been disclosed and described by way of only two embodiments, it is apparent to those skilled in the art that other embodiments and modifications of the present invention are possible without departing from the spirit or essential features thereof.

We claim:

1. A programmable logic device, comprising:
an AND array having a programmable memory cell provided at each intersection between a plurality of input term lines and a first plurality of product term lines;
an OR array having a programmable memory cell provided at each intersection between a second plurality of product term lines of the same number as said first plurality of product term lines and a plurality of output term lines;
a first decoder arrangement operatively connected to said AND array and selecting one of said input term lines in response to a first address signal when said AND array is selected;
a second decoder arrangement operatively connected to said AND array and selecting one of said first product term lines in response to a second address signal when one of said AND array and said OR array is selected;
a third decoder arrangement operatively connected to said OR array and selecting one of said output term lines in response to a third address signal when said OR array is selected; and
a buffer circuit, operatively connected between said first plurality of product term lines and said second plurality of product term lines for converting a first voltage of a first product term line selected by said second decoder arrangement to a second voltage which is higher than said first voltage and applying said converted second voltage to a corresponding second product term line, wherein programming of a programmable memory cell in said OR array selected by said second and third decoder arrangements is carried out.

2. A device as set forth in claim 1, wherein said buffer circuit includes a first transistor connected to a first power supply line changeable between two voltage values and a second transistor connected between said first transistor and a second power supply line which is lower than said first power supply line, and in response to a signal level present at a first product term line, driving a corresponding second product term line, thereby being brought to an enable state even in a write operation of data.

3. A device as set forth in claim 2, wherein said first transistor and said second transistor constitute an inverter and a third N channel type transistor is connected between an input of said inverter and said first product term line, a gate of said third transistor receiving a bias voltage preset to a half of a voltage employed in a normal operation of said device.

4. A device as set forth in claim 3, wherein said inverter is composed of an N type metal oxide semiconductor structure and a fourth P channel type transistor is connected between said input of said inverter and a power supply line employed in said normal operation, a gage of said fourth transistor being connected to said second power supply line.

5. A device as set forth in claim 3, wherein said inverter is composed of a complementary metal oxide semiconductor structure and a fifth P channel type transistor is connected between said input of said inverter and said first power supply line, a gate of said fifth transistor being connected to said second power supply line.

6. A device as set forth in claim 2, wherein said first power supply line changeable between two voltage values normally has a voltage necessary for a normal operation of said device and is changed to a voltage higher than said voltage necessary for normal device operation when said write operation of data is carried out.

* * * * *